United States Patent [19]

Parish et al.

[11] Patent Number: 5,940,095
[45] Date of Patent: Aug. 17, 1999

[54] INK JET PRINT HEAD IDENTIFICATION CIRCUIT WITH SERIAL OUT, DYNAMIC SHIFT REGISTERS

[75] Inventors: George Keith Parish, Winchester; Lawrence Russell Steward, Lexington, both of Ky.

[73] Assignee: Lexmark International, Inc., Lexington, Ky.

[21] Appl. No.: 08/534,674

[22] Filed: Sep. 27, 1995

[51] Int. Cl.[6] .............................. B41J 29/393; B41J 2/14; B41J 2/16
[52] U.S. Cl. ................................ 347/19; 347/49
[58] Field of Search .............................. 347/19, 10, 237, 347/14, 49, 59

[56] References Cited

U.S. PATENT DOCUMENTS

| | | | |
|---|---|---|---|
| 3,852,563 | 12/1974 | Bohorquez et al. | 219/216 |
| 4,411,540 | 10/1983 | Nozaki et al. | 400/175 |
| 4,689,494 | 8/1987 | Chen et al. | 327/525 |
| 4,695,853 | 9/1987 | Hackleman et al. | 347/62 |
| 4,716,421 | 12/1987 | Ozawa et al. | 347/14 |
| 4,719,477 | 1/1988 | Hess | 347/59 |
| 4,803,500 | 2/1989 | Milbrandt | 347/49 |
| 4,853,718 | 8/1989 | ElHatem et al. | 347/7 |
| 4,872,027 | 10/1989 | Buskirk et al. | 347/19 |
| 4,899,180 | 2/1990 | Elhatem et al. | 347/59 |
| 4,902,244 | 2/1990 | Endo et al. | 439/489 |
| 4,930,915 | 6/1990 | Kikuchi et al. | 400/175 |
| 4,947,192 | 8/1990 | Hawkins et al. | 346/140 |
| 4,963,897 | 10/1990 | Kattner | 346/140 |
| 5,033,887 | 7/1991 | Bauerle | 400/175 |
| 5,049,898 | 9/1991 | Arthur et al. | 347/19 |
| 5,049,904 | 9/1991 | Nakamura et al. | 346/140 |
| 5,103,246 | 4/1992 | Dunn | 346/140 |
| 5,144,336 | 9/1992 | Yeung | 346/76 |
| 5,235,351 | 8/1993 | Koizumi | 346/140 |
| 5,289,210 | 2/1994 | Takayanagi | 346/140 |
| 5,363,134 | 11/1994 | Barbehenn et al. | 347/49 |
| 5,504,507 | 4/1996 | Watrobski et al. | 347/19 |
| 5,585,836 | 12/1996 | Pham et al. | 347/237 |

FOREIGN PATENT DOCUMENTS

| | | |
|---|---|---|
| 0 315 417 A2 | 10/1989 | European Pat. Off. . |
| 0 378 439 A2 | 1/1990 | European Pat. Off. . |
| 0 571 093 A2 | 4/1993 | European Pat. Off. . |
| 0 541 064 A2 | 12/1993 | European Pat. Off. . |

OTHER PUBLICATIONS

"Integrating The Printhead into the HP DeskJet Printer" by J. Paul Harmon and John A. Widder; Hewlett–Packard Journal, Oct. 1988; pp. 62–66.

*Primary Examiner*—N. Le
*Assistant Examiner*—Thinh Nguyen
*Attorney, Agent, or Firm*—John J. McArdle

[57] ABSTRACT

An ink jet print head identification system for providing print head identifying information to the electronics of an ink jet printer includes one or more parallel load, serial out, dynamic shift registers integrated into a print head chip having a plurality of address lines interconnecting the printer electronics and print head electronics. Each shift register is programmed or encoded with a single digital bit. In one embodiment, a voltage pulse (load signal) received on a single chip address line by a plurality of shift registers loads the input of each encoded register with the register's own encoded bit. Two of the address lines provide each of the registers with successive sequential clock signals to serially shift the encoded information to an output device where the print head identifying information is read by the printer electronics. Other embodiments of the invention may employ any number of encoded registers independently of the number of available address lines.

25 Claims, 2 Drawing Sheets

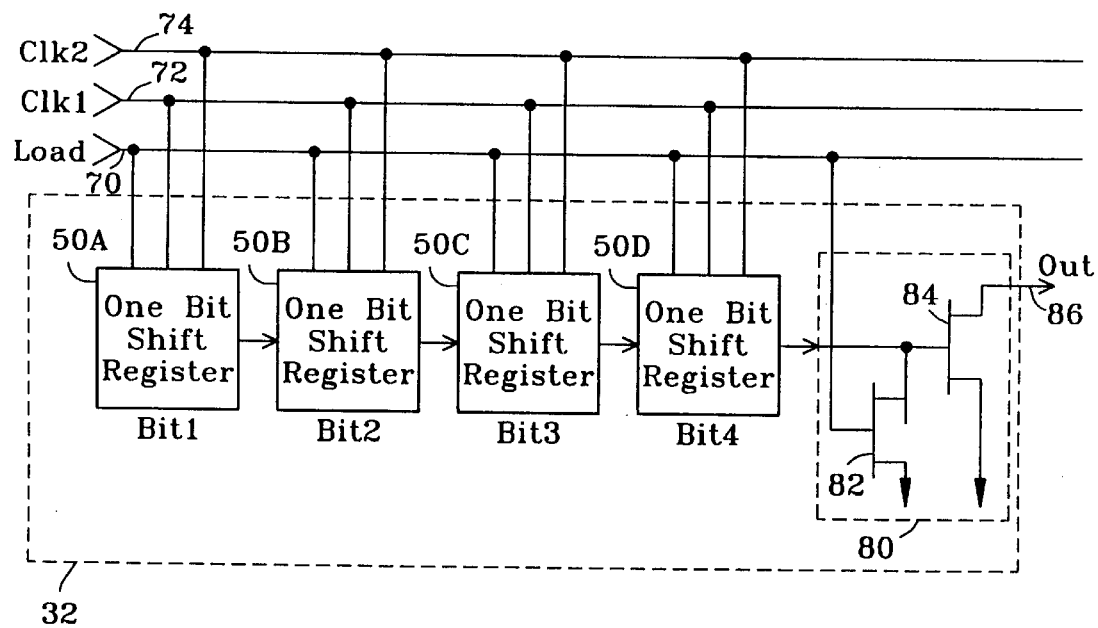
*Fig.* 3
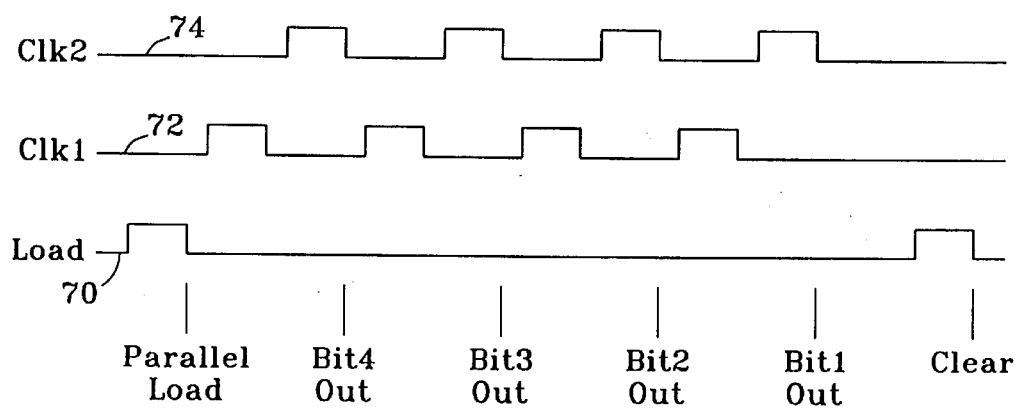
*Fig.* 4

INK JET PRINT HEAD IDENTIFICATION CIRCUIT WITH SERIAL OUT, DYNAMIC SHIFT REGISTERS

TECHNICAL FIELD

The present invention relates to an ink jet print head identification circuit and method. More particularly, it relates to an ink jet print head identification circuit that employs shift registers for serially transmitting a print head identification code to an ink jet printer controller.

BACKGROUND

Ink jet type printers employ a printing head that consists of a series of nozzles, or orifices positioned in an orifice plate for expelling ink onto a printing surface. The ink can be expelled by a variety of means, including continuous, piezoelectric, and thermal/bubble jet. While several different ink jet technologies have evolved over the past two decades, the most popular ink jet technology today is the bubble jet where ink within a chamber is locally superheated to form an expanding bubble which propels a drop of ink through an orifice and onto the printing surface. Piezoelectric printers function in a similar manner inasmuch as ink is expelled through an orifice. However, instead of boiling the ink in a chamber, the ink is essentially squeezed from the chamber as a result of deflections/expansions generated by a piezoelectric ceramic transducer. The ceramic transducer changes its physical dimensions when subjected to an electric field, thereby generating a pressure wave within the ink chamber and expelling an amount of ink through the chamber orifice. Both piezoelectric and bubble-jet methodologies are considered "drop-on-demand" or "impulse" technologies, i.e., a drop of ink is ejected from the print head only when desired.

Each type of ink jet print technology requires its own unique type of print head, and print heads may further vary based on parameters such as whether the print head contains only black ink, or whether it is capable of color printing. Generally, the different types of print heads are interchangeable, except that most printers are unable to accommodate both black ink and color due to physical differences between the print heads, i.e., print heads designed for color printing are typically larger to accommodate a variety of ink colors. Other print head parameters include architecture, resolution, number of ink jet nozzles, and spacing between the nozzles. Because print heads are interchangeable, the printer electronics must know what particular type of print head is installed, as well as information relating to the various print head parameters, so that algorithms within the printer control system can be reconfigured to provide appropriately formatted print commands to the print head electronics.

Therefore, it is desirable to provide the printer electronics with information relating to the characteristics of the particular print head that is installed. This can be done by digitally encoding the identifying information into the print head electronics and enabling the printer electronics to retrieve that information as it is needed.

A number of attempts have been made in the prior art to provide print head identifying information to the printer electronics. U.S. Pat. No. 4,872,027 to Buskirk et al. discloses providing extra electrical contact pads on the resistor network/array which fires the nozzles of the print head. These contact pads are selectively electrically connected in the resistor network to fire the individual nozzles in one of several unique configurations, each of which defines a specific print head. The code provided by these unique configurations of the electrical pads is detectable by the printer so that the type of head installed is determinable. This is accomplished by selectively connecting the individual electrical pads (or not connecting them) to the resistor circuits or circuit traces. By individually toggling the resistor lines at high or low voltage levels and detecting a voltage level shift on the lines associated with the extra contact pads, a connection (or lack thereof) may be detected.

Other prior art approaches to providing print head identifying information to the printer disclose identification circuitry disposed in the print head. U.S. Pat. No. 4,930,915 to Kikuchi et al. discloses print head identification means disposed in a print head. In one embodiment, a 24-pin print head is identified when the printer electronics read a "high" state value on a signal line interconnecting the printer electronics and identification means. A 9-pin print head is identified by a "low" state signal. In another embodiment of the Kikuchi invention, a parallel-serial converter produces a predetermined identification signal.

U.S. Pat. No. 5,363,134 to Barbehenn et al. discloses an integrated circuit for use in the print head of an ink jet printer. The integrated circuit includes an array circuit having a plurality of resistor cells arranged into rows and columns for heating an ink reservoir to produce a pattern of ink jets. A corresponding number of row and column lines are coupled to the array circuit for selecting and energizing the resistor cells according to the desired print pattern. An identification circuit is integrated into the same substrate as the array circuit. The identification circuit is programmable by means of a plurality of programmable paths corresponding and coupled to each row line. These programmable paths each include a programmable fuse and an active device connected in series. The opposite ends of the programmable paths are coupled together at a common node, which in turn is coupled to an output circuit for providing a single serial output signal in response to a sequential polling of the row lines.

The number of bits of identifying information that Barbehenn is capable of providing to the printer electronics is limited to the number of row lines available. For example, if there are a total of seven row lines interconnecting the array circuit with the printer electronics, then Barbehenn's identification circuit will be limited to storing seven and only seven bits of identifying information because each of the programmable paths correspond with and are coupled to a unique one of the row lines. To provide an identification circuit that contains greater than seven bits of identifying information, Barbehenn would be required to increase the number of row lines, or address lines available.

Thus, there is a need for an efficient, inexpensive, print head identification circuit that preferably is not limited by the number of address lines interconnecting the existing print head electronics and printer electronics.

SUMMARY

The present invention discloses an identification system for providing ink jet print head identifying information in ink jet printers having ink jet print heads. The system includes a controller and drive circuit for transmitting signals including at least one clock signal in the form of clock pulses. The controller and drive circuit also receive signals. A plurality of address lines are provided for transmitting signals, including the at least one clock signal, from the controller and drive circuit to the ink jet print head. An identification circuit disposed in the ink jet print head contains a digital code corresponding to the print head identifying information. The identification circuit is connected to receive the at least one clock signal from the address lines and is responsive to the at least one clock signal to serially transmit the digital code. An output line is connected to the identification circuit for transmitting the bits of the digital code to the controller. The controller is connected to receive the bits of the digital code from the output line, and programmed to interpret the digital code and determine the print head identifying information.

The identification system may further include a temperature sense circuit connected to the output line for transmitting information corresponding to the temperature of the print head.

An example of the identification circuit includes a predetermined number of shift registers. Each of these shift registers is programmed in accordance with the digital code to produce an output of either a logic one or a logic zero in response to the at least one clock signal.

The controller and drive circuit may be configured to transmit at least one load signal on the address lines. When so configured, the identification circuit includes a predetermined number of shift registers where each shift register is programmed in accordance with the digital code to produce an output of either a logical one or a logical zero in response to the at least one load signal and the at least one clock signal. The controller is programmed to transmit the load signal and, following the load signal transmission, to interpret a next predetermined number of bits on the output line as the digital code.

The controller and drive circuit may also be configured to transmit at least one load signal and first and second clock signals on the address lines. In such a case, the identification circuit includes a load circuit and a transmit circuit. The load circuit is connected to receive the load signal from the address lines, and is responsive to the load signal to load the digital code into the transmit circuit as the loaded digital code. The transmit circuit is responsive to the loaded digital code and the first and second clock signals to serially transmit the digital code on the output line. The controller is programmed to transmit the load signal and, following the load signal transmission, to interpret a next predetermined number of bits on the output line as the digital code.

In another embodiment of the present invention, an ink jet print head identification circuit is integrated into an ink jet print head chip having print head electronics, a plurality of address lines, and a print head temperature sense circuit with an output. The identification circuit provides print head identifying information to an ink jet printer and includes an output device and a plurality of programmed one bit shift registers. The shift registers are interconnected to the address lines and the output device for serially shifting the programmed contents of the registers to the output device in response to signals received on the address lines.

The signals may, for example, include at least one clock signal and a load signal. In this example, the registers are interconnected to each other to serially shift their programmed contents to the output device in response to the at least one clock signal and the load signal.

As an example of the output device, there is an output transistor having a source, drain, and gate. The gate of the output transistor receives the serially shifted, programmed contents of the shift registers. A pull up device pulls up the signal level on the drain of the output transistor. The programmed contents of the shift registers are received by the output transistor. A discharge device discharges parasitic capacitance at the gate of the output transistor following reception of the programmed contents.

Another preferred embodiment of the present invention is disclosed where an ink jet print head integrated circuit provides print head identifying information to ink jet printer electronics. The integrated circuit includes a print head array circuit. A plurality of address lines are connected for transmitting signals from the printer electronics to the print head array circuit. The address lines include lines for conveying first and second clock signals and a line for conveying a load signal. A temperature sense circuit having an output is connected to the printer electronics. A programmed identification circuit is connected to receive the first and second clock signals and the load signal. The identification circuit also provides print head identifying information to the temperature sense circuit output in serial digital format in response to the first and second clock signals and the load signal.

An example of the identification circuit for this embodiment includes a load circuit and a transmit circuit. The load circuit is connected to receive the load signal from the address lines and is responsive to the load signal to load the identifying information into the transmit circuit. The transmit circuit is responsive to the loaded identifying information and the first and second clock signals to serially transmit the loaded identifying information on the temperature sense circuit output.

The present invention also discloses a method for providing ink jet print head identifying information to an ink jet printer having printer electronics and an ink jet print head. The print head includes an integrated circuit having print head array electronics, a temperature sense circuit with an output connected to the printer electronics, an identification circuit, an output device connected to the temperature sense circuit output, and a plurality of address lines interconnecting the identification circuit and printer electronics. The method includes the steps of programming a digital code having one or more bits into the identification circuit. Each bit of the code is programmed as either an electrically conducting short or a non-conducting gap, where the digital code corresponds to the print head identifying information. Signals generated by the printer electronics, including at least one clock signal in the form of clock pulses, are transmitted on the address lines to the identification circuit. One or more bits of the digital code are transmitted to the output device in serial digital format in response to the signals generated by the printer electronics. The digital code is read by the printer electronics as it is transmitted to the output device.

The method may further include the step of determining the identifying information from the transmitted digital code by the printer electronics based in part on the condition of each bit as either a gap or a short.

The method may also include the step of transmitting a load signal, as a printer electronics signal, to the identification circuit via the address lines.

As another additional step in the method, the output device may be reset following transmission of the digital code to the output device.

BRIEF DESCRIPTION OF THE PREFERRED EMBODIMENTS

The preferred embodiments of the invention will now be described in further detail with reference to the drawings wherein like reference characters designate like or similar elements thoughout the several drawings as follows:

FIG. 3 is a block diagram of a four bit, parallel in, serial out identification circuit; and FIG. 4 is a timing chart for the circuit of FIG. 3.

DETAILED DESCRIPTION OF THE PREFERRED EMBODIMENT

Figure 1:
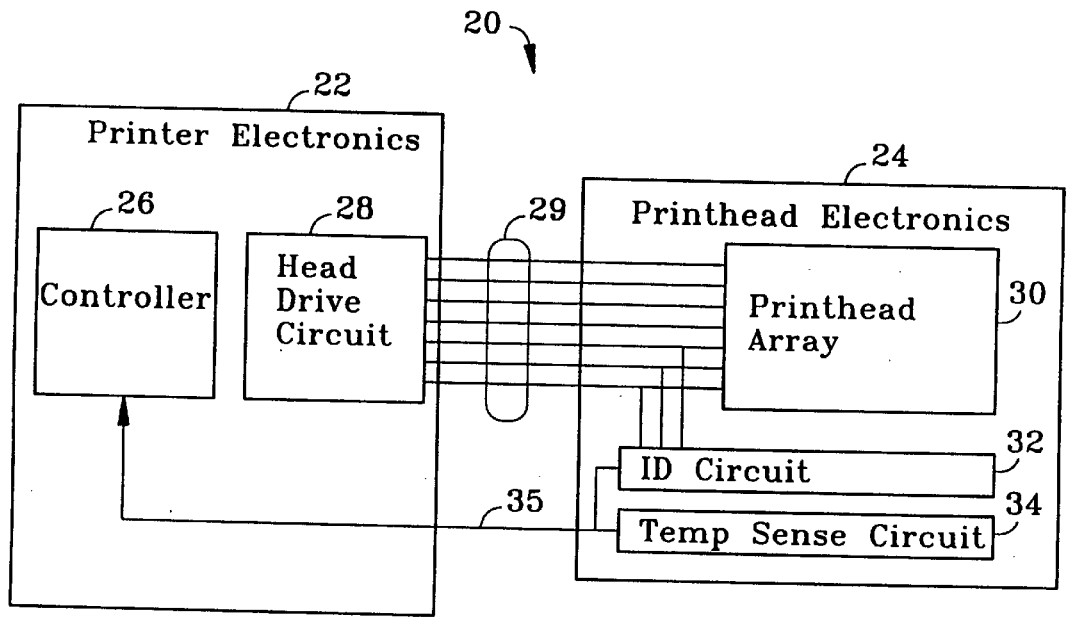
FIG. 1 is a block diagram of the print head identification system.

In accordance with a preferred embodiment of the present invention, there is shown in FIG. 1 a block diagram of an ink jet print head identification system 20 including ink jet printer electronics 22 and ink jet print head electronics 24. Typically, bubble jet print heads incorporate a resistor array, or print head array 30 for selectively boiling and expelling ink through orifices in an orifice plate (not shown) on the print head. Resistors within the array 30 are selectively energized through appropriate signals received from the printer electronics 22 on address lines 29. Within the printer electronics 22 a microprocessor controller 26, which is typically an ASIC controller providing TTL level outputs, sends print data commands to a head drive circuit 28. In a preferred embodiment, the drive circuit 28 is a TEXAS INSTRUMENTS 75373, 100 milliamp, push-pull driver.

Drive circuit 28 converts print data commands received from the controller 26 into appropriately formatted analog pulses which are demultiplexed and sequentially provided to the print head electronics 24 via address lines 29. These analog pulses possess sufficient intensity to heat the resistors within the print head array 30 so that ink within the print head boils to form a bubble, thereby expelling ink through an orifice. The number of address lines 29 available will vary depending on the particular printer that is used.

Because different styles and types of ink jet print heads requiring differently formatted analog pulses are interchangeable in ink jet printers, it is important for the printer electronics 22 to possess information relating to the print head that is installed in the printer. In other words, it is important for the printer electronics 22 to be provided with information corresponding to the parameters of the ink jet print head, including parameters such as whether the print head contains only black ink, whether the print head contains color ink, the color of the ink, and other print head parameters. In similar fashion, ink contained in the print head is characterized as having ink parameters, including ink color, which correspond to the print head identifying information. Print head parametric information is useful to the printer electronics 22 because it allows the printer electronics 22 to reconfigure print control algorithms to produce analog pulses that are appropriate for the specific print head installed. The present invention provides print head identifying information to the printer electronics 22 by encoding the information digitally in an identification (ID) circuit 32 that is integrated into the print head electronics 24 during fabrication.

Typically, print head electronics 24 are fabricated as a single integrated chip. In addition to the print head resistor array 30 and corresponding address line connections 29, the chip will normally incorporate a temperature sense circuit 34. The temperature sense circuit 34 is typically a metal resistor that senses the temperature of the print head during printing. The sensed temperature is provided as an analog signal to the printer controller 26 on output line 35, enabling the printer controller 26 to monitor the print head for overheat conditions.

To reduce I/O requirements, the ID circuit 32 of the present invention uses some, but not all, of the existing address lines 29 for receiving inputs from the printer electronics 22 and it uses the existing temperature sense output 35 to serially transmit the encoded print head identifying information to the printer electronics 22. A maximum of three address lines are used by the ID circuit 32 to receive inputs, and the number of encoded bits of information within the ID circuit 32 is independent of the number of address lines 29 used. There is minimal or no interference with the temperature sense output 35 during normal operation because the printer electronics 22 will read temperature sense only when the printer is idle.

Figure 2:
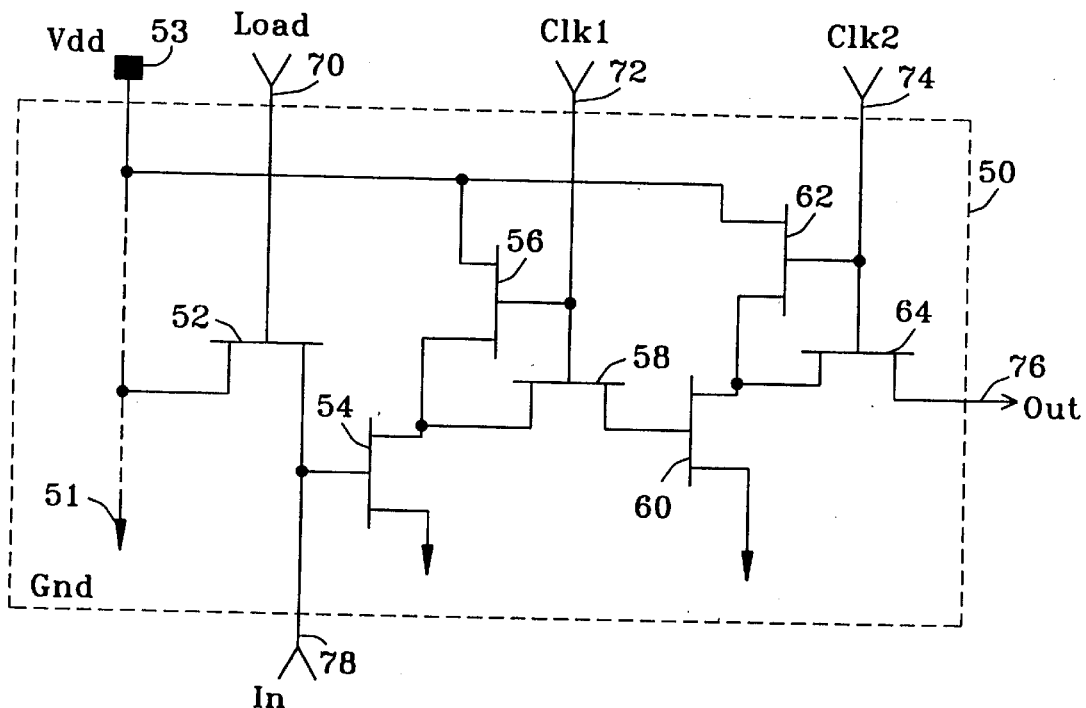
FIG. 2 is a circuit diagram of a one bit dynamic shift register.

In a preferred embodiment, print head identifying information is digitally encoded into the ID circuit 32 by means of one or more programmed, one bit dynamic shift registers 50 such as the one shown in FIG. 2. The shift register 50 is, for example, mask programmed during fabrication by either connecting the source of load transistor 52 to ground 51 to produce a logic "0" when the gate of load transistor 52 is made active by a load signal 70 received on one of the address lines 29, or by connecting the source of load transistor 52 to a voltage source 53 to produce a logic "1" when the gate of load transistor 52 is active. When the gate of load transistor 52 becomes active by load signal 70, the programmed logic, or voltage level is passed to the gate of input transistor 54. After transistor 52 turns off, the passed voltage level will remain stored in the parasitic gate capacitance of input transistor 54. Because the voltage at the gate of input transistor 54 will eventually discharge due to leakage currents, the voltage is considered dynamically stored on the gate.

With the input 78 loaded with the programmed voltage level, it can now be shifted to the output 76. This is accomplished by sequential clock signals transmitted by the printer electronics 22 and received by the shift register 50. A clock 1 input is received on line 72 and a clock 2 input is received on line 74, where each clock input 72, 74 is received from the printer electronics 22 via a separate address line 29. A voltage pulse on the clock 1 input 72 passes the logical inverse from the gate of input transistor 54 to the gate of output transistor 60. When the clock 1 input 72 is active, load transistor 56 turns on as does pass transistor 58. If the input 78 of the shift register 50 is a logic "1", input transistor 54 will turn on and the gate of output transistor 60 will discharge. If the input 78 of the shift register 50 is a logic "0", input transistor 54 will remain off and the gate of output transistor 60 will be charged through load transistor 56 and pass transistor 58. When the voltage pulse on the clock 1 input 72 goes inactive, pass transistor 58 turns off and the voltage level (i.e., the logic inverse of the voltage level that was parasitically stored on the gate of input transistor 54) will be dynamically stored on the gate of output transistor 60.

A voltage pulse on the clock 2 input 74 passes the logic inverse from the gate of output transistor 60 to the output 76 of the shift register. When the clock 2 pulse is active, load transistor 62 turns on as does pass transistor 64. The logic inverse of the gate voltage on output transistor 60 passes to the output 76 of the shift register. Therefore, after successive pulses on the clock 1 and 2 inputs 72, 74, the logic level on input 78 is passed to the output 76 as a single bit.

It should be noted that, because the load transistors 52, 56, 62 are off at all times except during clock pulses, the register 50 of FIG. 2 consumes little power.

In a preferred embodiment, several shift registers 50 are connected in series to provide a digital code, such as the four bit example shown in FIG. 3. A voltage pulse on load signal 70 initiates a parallel load of the encoded logic level, or bit encoded within each of the four shift registers 50A–D. As previously discussed, this results in the programmed logic level being dynamically stored at the input 78 (FIG. 2) of each shift register 50A–D. A pulse on the clock 1 input 72 followed by a pulse on the clock 2 input 74 shifts the logic level from each register input 78 to each register output 76 so that each register output 76 is dynamically stored on the input 78 of the next register.

With each clock 1 and clock 2 sequence of pulses, each programmed bit is successively and serially shifted to an output device 80 and read by the controller 26 until all bits have been read by the controller 26. The controller 26 is programmed to interpret the code and determine the print head identifying information and reconfigure print control algorithms accordingly. In this manner, a single ink jet printer is able to accommodate many different type of print heads.

As shown in FIG. 3, the output device 80 preferably includes an open drain output transistor 84 and a discharge transistor 82. The voltage level at the drain of output transistor 84 is pulled up on line 86 through a load device (not shown) within the printer electronics 22 (FIG. 1) so that the printer controller 26 reads a programmed logic level after each clock 2 pulse. For example, when a clock 2 pulse causes a programmed logic level "1" to be transmitted to the gate of output transistor 84, output transistor 84 will become active and the drain will be pulled down. The controller 26 detects the lowered voltage level at the drain by reading the voltage level at line 86 and thereby senses that a logic level "1" has been transmitted by the ID circuit 32. Similarly, with each successive clock 2 pulse the programmed logic levels of the shift registers 50A–D are sequentially shifted and serially transmitted to output transistor 84 to be read by the controller 26. FIG. 4 is a timing chart for serial transmission of four bits of encoded information by the ID circuit 32 of FIG. 3.

With continued reference to FIG. 3, the open drain output 86 preferably utilizes an existing chip I/O line to serially transmit the encoded identifying information to the printer controller 26, such as the temperature sense output 35. Utilization of the existing temperature sense output 35, along with the fact that the encoded information is serially transmitted, eliminates the need for additional chip output lines. After all bits of the encoded information have been read, a pulse on the load signal line 70 activates discharge transistor 82 to discharge the gate of output transistor 84, thereby enabling valid temperature sense information to be transmitted to the controller 26 immediately after the gate of output transistor 84 has been discharged. To prevent possible interference with normal operation of the temperature sense circuit 34, a pulse is output by the controller 26 on the load signal line 70 prior to each read of the temperature sense circuit 34. This ensures that the gate of output transistor 84 remains discharged during temperature control operations.

The controller 26 reads the serial digital output on line 86 and determines print head identifying information by comparing the received bit pattern against stored correlations of print head information. With the print head properly identified by the printer controller 26, the controller 26 is now able to reconfigure its control system algorithms to accommodate printing with the installed print head.

It will be understood that any number of shift registers 50 may be employed in the present invention without increasing the required number of address lines 29. Therefore, there is disclosed an ink jet print head identification circuit 32 for serially transmitting to the printer controller 26 a digital code containing print head identifying information where the number of bits comprising the digital code is independent of the total number of address lines 29 available.

It is contemplated, and will be apparent to those skilled in the art from the foregoing specification and drawings that modifications and/or changes may be made in the embodiments of the invention. Accordingly, it is expressly intended that the foregoing are illustrative of preferred embodiments only, not limiting thereto, and that the true spirit and scope of the present invention be determined by reference to the appended claims.

What is claimed is:

1. An identification system for providing ink jet print head identifying information in ink jet printers having ink jet print heads, comprising:

a controller and drive circuit for transmitting signals including first and second clock signals in the form of clock pulses and for receiving signals;

a plurality of address lines for conducting signals including said first and second clock signals from the controller and drive circuit to the inklet print head;

an identification circuit having a plurality of mask programmed, one-bit shift registers disposed in the ink jet print head, each of said one-bit shift registers containing one bit of a digital code corresponding to the print head identifying information, said identification circuit being connected to receive said first and second clock signals from said address lines and being responsive to said first and second clock signals to serially transmit the digital code, a clock signal being defined as a sequential series of pulses on a single line;

an output line connected to said identification circuit for conducting the bits of the digital code to the controller; and said controller being connected to receive the bits of the digital code from the output line and being programmed to interpret the digital code and determine the print head identifying information.

2. The system of claim 1 wherein each of said mask programmed, one-bit shift registers includes:

a power input for receiving excitation voltage from a voltage source;

a power ground;

a first load transistor having a source, a gate connected to receive said load signal, and a drain;

a mask programmable portion of the shift register being mask programmable to either connect the source of the first load transistor to the voltage source to provide a one-bit shift register having a first digital value or to connect the source of the first load transistor to the power ground to provide a one-bit shift register having a second digital value which is different than the first digital value;

an input transistor having a source, a gate connected to the drain of the first load transistor, and a drain;

a first pass transistor having a source connected to the drain of the input transistor, a gate connected to receive said first clock signal, and a drain;

a second load transistor having a source connected to said voltage source, a gate connected to the gate of the first pass transistor, and a drain connected to the source of the first pass transistor;

a first output transistor having a source, a gate connected to the drain of the first pass transistor, and a drain;

a third load transistor having a source connected to said voltage source, a gate connected to receive said second clock signal, and a drain connected to the drain of the first output transistor; and a second pass transistor having a source connected to the drain of the third load transistor, a gate connected to the gate of the third load transistor, and a drain for outputting a first or a second digital value in response to said load and clock signals.

3. The system of claim 1 further comprising:

said controller and drive circuit further transmitting at least one load signal;

said address lines for transmitting said at least one load signal;

said identification circuit including a load circuit and a transmit circuit, said load circuit being connected to receive said load signal from said address lines and being responsive to the load signal to load the digital code into the transmit circuit, said transmit circuit being responsive to said first and second clock signals after being loaded with the digital code to serially transmit the digital code on the output line;

said controller being programmed to transmit said at least one load signal and, following said at least one signal transmission, interpret a next predetermined number of bits on the output line as the digital code.

4. The system of claim 1 further comprising:

said controller and drive circuit further transmitting at least one load signal;

said address lines for transmitting said at least one load signal and said first and second clock signals;

said identification circuit including a load circuit and a transmit circuit, said load circuit being connected to receive said at least one load signal from said address lines and being responsive to said at least one load signal to load the digital code into the transmit circuit as the loaded digital code, said transmit circuit being responsive to the loaded digital code and the first and second clock signals to serially transmit the digital code on the output line;

said controller being programmed to transmit said at least one load signal and, following said at least one load signal transmission, interpret a next predetermined number of bits on the output line as the digital code.

5. The system of claim 1 wherein said identification circuit further comprises:

a load circuit connected to receive a load signal from said address lines and being responsive to the load signal to load the digital code for serial transmission; and a transmit circuit for being loaded with the digital code by the load circuit and being responsive to said first and second clock signals to serially transmit the multibit code to said output line.

6. The system of claim 1, further comprising a temperature sense circuit connected to said output line for transmitting information corresponding to the temperature of the print head.

7. An identification system for providing ink jet print head identifying information in ink jet printers having ink jet print heads, comprising:

a controller and drive circuit or transmitting signals including at least one clock signal in the form of clock pulses and a load signal and for receiving signals;

a plurality of address lines for transmitting signals including said at least one clock signal and said load signal from the controller and drive circuit to the ink jet print head;

an identification circuit disposed in the ink jet print head and containing a digital code which includes bits corresponding to die print head identifying information, being connected to receive said at least one clock signal from said address lines and being responsive to said at least one clock signal to serially transmit the digital code, said identification circuit including a mask programmed, one-bit shift register having:

a power input for receiving excitation voltage from a voltage source;

a first load transistor having a source, a gate connected to receive said load signal, and a drain;

a mask programmable portion of the shift register being mask programmable to either connect the source of the first load transistor to the voltage source to provide a one-bit shift register having a first digital value or to connect the source of the first load transistor to the power ground to provide a one-bit shift register having a second digital value which is different than the first digital value;

an input transistor having a source, a gate connected to the drain of the first load transistor, and a drain;

a first pass transistor having a source connected to the drain of the input transistor, a gate connected to receive a first clock signal, and a drain;

a second load transistor having a source connected to said voltage source, a gate connected to the gate of the first pass transistor, and a drain connected to the source of the first pass transistor;

a first output transistor having a source, a gate connected to the drain of the first pass transistor, and a drain;

a third load transistor having a source connected to said voltage source, a gate connected to receive a second clock signal, and a drain connected to the drain of the first output transistor; and a second pass transistor having a source connected to the drain of the third load transistor, a gate connected to the gate of the third load transistor, and a drain for outputting a first or a second digital value in response to said load and clock signals;

an output line connected to said identification circuit for transmitting the bits of the digital code to the controller; and said controller being connected to receive the bits of the digital code from the output line and being programmed to interpret the digital code and determine the print head identifying information.

8. An ink jet print head identification circuit for use in an ink jet printer having printer electronics producing signals, said identification circuit being integrated into an ink jet print head chip having print head array electronics, a print head temperature sense circuit with an output, and a plurality of address lines for interconnecting the print head array electronics and the printer electronics of the ink jet printer and for receiving signals produced by the printer electronics, said identification circuit providing print head identifying information to an ink jet printer, the identification circuit comprising:

an output device; and a plurality of mask programmed one bit shift registers having programmed contents in the form of either a logic "1" or a logic "0" and being interconnected to the address lines and the output device for serially shifting the programmed contents of the registers to the output device in response to signals received on the address lines.

9. The identification circuit of claim 8, further comprising:
said signals including at least one clock signal and a load signal;
said registers further interconnected to each other to serially shift said programmed contents to the output device in response to said at least one clock and said load signals.

10. The identification circuit of claim 8 wherein said output device comprises:
an output transistor having a source, drain, and gate, said gate receiving the serially shifted, programmed contents of the shift registers;
a pull up device for applying a pull up voltage to the drain of said output transistor, said programmed contents being reflected in the voltage at said drain as the programmed contents are received by the output transistor; and
a discharge device for discharging parasitic capacitance at the gate of said output transistor following reception of the programmed contents.

11. An ink jet print head integrated circuit for providing print head identifying information to ink jet printer electronics, said circuit comprising:
a print head array circuit;
a plurality of address lines connected to the printer electronics and to said print head array circuit for conducting signals from the printer electronics to the print head array circuit, said address lines including lines for conducting first and second clock signals and a line for conducting a load signal, a clock signal being defined as a sequential series of pulses on a single line;
a temperature sense circuit having an output connected to the printer electronics; and
a programmed identification circuit connected to receive said first and second clock signals and said load signal, and for providing print head identifying information to the temperature sense circuit output in serial digital format in response to said first and second clock signals and said load signal, said identification circuit including a mask programmed, one-bit shift register having:
a power input for receiving excitation voltage from a voltage source;
a power ground;
a first load transistor having a source, a gate connected to receive said load signal, and a drain;
a mask programmable portion of the shift register being mask programmable to either connect the source of the first load transistor to the voltage source to provide a one-bit shift register having a first digital value or to connect the source of the first load transistor to the power ground to provide a one-bit shift register having a second digital value which is different than the first digital value;
an input transistor having a source, a gate connected to the drain of the first load transistor, and a drain;
a first pass transistor having a source connected to the drain of the input transistor, a gate connected to receive said first clock signal, and a drain;
a second load transistor having a source connected to said voltage source, a gate connected to the gate of the first pass transistor, and a drain connected to the source of the first pass transistor;
a first output transistor having a source, a gate connected to the drain of the first pass transistor, and a drain;
a third load transistor having a source connected to said voltage source, a gate connected to receive said second clock signal, and a drain connected to the drain of the first output transistor; and
a second pass transistor having a source connected to the drain of the third load transistor, a gate connected to the gate of the third load transistor, and a drain for outputting a first or a second digital value in response to said load and clock signals.

12. The integrated circuit of claim 11 wherein said identification circuit comprises a plurality of mask programmed, one-bit shift registers, each of said one-bit shift registers being mask programmed in accordance with the identifying information to produce an output of either a logical one or a logical zero in response to said first and second clock signals and said load signal.

13. An ink jet print apparatus characterized by:
an ink jet print head containing ink;
an identification circuit having a plurality of mask programmed, one-bit shift registers disposed in the ink jet print head, each of said one-bit shift registers containing one bit of a digital code corresponding to print head identifying information;
input lines connected to said identification circuit to receive at least one clock signal and at least one load signal and said identification circuit being responsive to the at least one clock signal and at least one load signal to serially transmit the digital code, a clock signal being defined as a sequential series of pulses on a single line; and
an output line for interconnecting said identification circuit and the printer for conducting the digital code when transmitted to provide the print head identifying information as an output.

14. The apparatus of claim 13 wherein each of said plurality of programmed one bit shift registers includes a load transistor which is electrically connected during fabrication of the identification circuit either to a voltage source to provide a first bit value or to ground to provide a second bit value which is different than said first bit value.

15. The apparatus of claim 14 wherein said identification circuit is further characterized as including an output device that serially holds and transmits a bit of the digital code on said output line.

16. The apparatus of claim 14 wherein said control signals are characterized as shift signals including at least one clock signal and at least one load signal.

17. The apparatus of claim 13 wherein said output line is further characterized as the output of a print head temperature sensing device.

18. The apparatus of claim 13 wherein said ink jet print head is further characterized as an ink jet print head for depositing, onto a print medium, ink having parameters corresponding to the print head identifying information.

19. The apparatus of claim 13 wherein said print head identifying information identifies parameters of the ink jet print head including ink color.

20. An ink jet print apparatus characterized by:
an ink jet print head containing ink;
an identification circuit disposed in the ink jet print head and containing a digital code which includes bits corresponding to print head identifying information;
wherein said ink jet print head is characterized as an ink jet print head for depositing, onto a print medium, ink having parameters corresponding to the print head identifying information;
input lines connected to said identification circuit to receive at least one clock signal and at least one load and said identification circuit being responsive to the at least one clock signal and at least one load signal to serially transmit the digital code, a clock signal being defined as a sequential series of pulses on a single line;

an output line for interconnecting said identification circuit and the printer for conducting the digital code when transmitted to provide the print head identifying information as an output;

wherein said identification circuit is further characterized as including a mask programmed, one-bit shift register having:

a power input for receiving excitation voltage from a voltage source;

a power ground;

a first load transistor having a source, a gate connected to receive said load signal, and a drain;

a mask programmable portion of the shift register being mask programmable to either connect the source of the first load transistor to the voltage source to provide a one-bit shift register having a first digital value or to connect the source of the first load transistor to the power ground to provide a one-bit shift register having a second digital value which is different than the first digital value;

an input transistor having a source, a gate connected to the drain of the first load transistor, and a drain;

a first pass transistor having a source connected to the drain of the input transistor, a gate connected to receive a first clock signal, and a drain;

a second load transistor having a source connected to said voltage source, a gate connected to the gate of the first pass transistor, and a drain connected to the source of the first pass transistor;

a first output transistor having a source, a gate connected to the drain of the first pass transistor, and a drain;

a third load transistor having a source connected to said voltage source, a gate connected to receive a second clock signal, and a drain connected to the drain of the first output transistor; and a second pass transistor having a source connected to the drain of the third load transistor, a gate connected to the gate of the third load transistor, and a drain for outputting a first or a second digital value in response to said load and clock signals.

21. An ink jet print apparatus for providing print head identifying information to an ink jet printer, said apparatus characterized by:

a printer control circuit for producing first and second clock signals and a load signal;

a plurality of address lines for conducting said first and second clock signals and said load signal, a clock signal being defined as a sequential series of pulses on a single line;

an ink jet print head;

ink contained in said print head;

an identification circuit disposed in the ink jet print head and containing a digital code corresponding to the print head identifying information, being connected to said address lines to receive the first and second clock signals and the load signal from the printer's control circuit and being responsive to the clock and load signals to serially transmit the digital code to the printer control circuit said identification circuit including a mask programmed, one-bit shift register having:

a power input for receiving excitation voltage from a voltage source;

a power ground;

a first load transistor having a source, a gate connected to receive said load signal, and a drain;

a mask programmable portion of the shift register being mask programmable to either connect the source of the first load transistor to the voltage source to provide a one-bit shift register having a first digital value or to connect the source of the first load transistor to the power ground to provide a one-bit shift register having a second digital value which is different than the first digital value;

an input transistor having a source, a gate connected to the drain of the first load transistor, and a drain;

a first pass transistor having a source connected to the drain of the input transistor, a gate connected to receive said first clock signal, and a drain;

a second load transistor having a source connected to said voltage source, a gate connected to the gate of the first pass transistor, and a drain connected to the source of the first pass transistor;

a first output transistor having a source, a gate connected to the drain of the first pass transistor, and a drain;

a third load transistor having a source connected to said voltage source, a gate connected to receive said second clock signal, and a drain connected to the drain of the first output transistor;

a second pass transistor having a source connected to the drain of the third load transistor, a gate connected to the gate of the third load transistor, and a drain for outputting a first or a second digital value in response to said load and clock signals; and an output line interconnecting said identification circuit and said printer control circuit for conducting the digital code to the printer control circuit;

wherein said printer control circuit interprets the digital code and determines the print head identifying information.

22. The apparatus of claim 21 wherein said identification circuit is further characterized as including a plurality of mask programmed, one-bit shift registers.

23. The apparatus of claim 22 wherein said print head identifying information identifies parameters of the ink jet print head including ink parameters.

24. The apparatus of claim 23 wherein said ink parameters are further characterized as colors.

25. A method for providing, to an ink jet printer, identifying information which identifies the type of ink jet print head that deposits, onto a print medium, ink having parameters corresponding to the identifying information, the method characterized by the steps of:

attaching an ink jet print head containing ink to an ink jet printer;

providing ink to the print head;

programming a digital code into an identification circuit disposed on the print head, each bit of the digital code being programmed as either an electrically conducting connection between a one-bit shift register and a voltage source or an electrically conducting connection between the one-bit shift register and ground, the digital code corresponding to the print head identifying information;

transmitting control signals generated by the printer to the identification circuit;

transmitting one or more bits of the digital code to an output device in serial digital format in response to the control signals;

reading the digital code by the printer as the digital code is transmitted by the output device; and identifying the type of print head and ink based on the print head identifying information.

* * * * *